US011727295B2

(12) United States Patent
Hart et al.

(10) Patent No.: US 11,727,295 B2
(45) Date of Patent: Aug. 15, 2023

(54) TUNABLE SUPERCONDUCTING RESONATOR FOR QUANTUM COMPUTING DEVICES

(71) Applicant: International Business Machines Corporation, Armonk, NY (US)

(72) Inventors: Sean Hart, Tarrytown, NY (US); Patryk Gumann, Tarrytown, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 940 days.

(21) Appl. No.: 16/373,334

(22) Filed: Apr. 2, 2019

(65) Prior Publication Data
US 2020/0320420 A1    Oct. 8, 2020

(51) Int. Cl.
| *H03K 17/00* | (2006.01) |
| *G06N 10/00* | (2022.01) |
| *H01P 7/06* | (2006.01) |
| *H03K 17/92* | (2006.01) |
| *H10N 69/00* | (2023.01) |

(52) U.S. Cl.
CPC ............ *G06N 10/00* (2019.01); *H01P 7/065* (2013.01); *H03K 17/92* (2013.01); *H10N 69/00* (2023.02)

(58) Field of Classification Search
None
See application file for complete search history.

(56) References Cited

U.S. PATENT DOCUMENTS

| 5,138,401 | A | * | 8/1992 | Yamazaki ............. H01L 29/437 257/E39.02 |
| 6,365,912 | B1 |  | 4/2002 | Booth et al. |
| 6,597,010 | B2 |  | 7/2003 | Eriksson et al. |
| 6,960,780 | B2 |  | 11/2005 | Blais et al. |
| 9,126,829 | B2 |  | 9/2015 | Wu |
| 9,379,303 | B2 |  | 6/2016 | Gambetta et al. |
| 9,501,748 | B2 |  | 11/2016 | Naaman et al. |
| 9,647,662 | B1 |  | 5/2017 | Abutaleb et al. |

(Continued)

FOREIGN PATENT DOCUMENTS

| CN | 102742045 A | 10/2012 |
| CN | 102969472 A | 3/2013 |

(Continued)

OTHER PUBLICATIONS

Casparis et al., "Voltage-controlled superconducting quantum bus", Physical Review B, vol. 99, No. 8, Feb. 2019.

(Continued)

*Primary Examiner* — Bradley Smith
(74) *Attorney, Agent, or Firm* — Garg Law Firm, PLLC; Rakesh Garg; Erik Johnson

(57) ABSTRACT

A superconducting coupling device includes a resonator structure. The resonator structure has a first end configured to be coupled to a first device and a second end configured to be coupled to a second device. A gate is positioned proximal to a portion of the resonator structure. The gate is configured to receive a gate voltage and vary a kinetic inductance of the portion of the resonator based upon the gate voltage. The varying of the kinetic inductance induces the resonator structure to vary a strength of coupling between the first superconducting device and the second superconducting device.

18 Claims, 8 Drawing Sheets

(56) References Cited

U.S. PATENT DOCUMENTS

| | | | |
|---|---|---|---|
| 9,691,033 | B2 | 6/2017 | Rogge et al. |
| 9,996,801 | B2 | 6/2018 | Shim et al. |
| 10,242,968 | B2 | 3/2019 | Das et al. |
| 2006/0283380 | A1* | 12/2006 | Lee .................. C30B 29/06 117/89 |
| 2016/0104073 | A1 | 4/2016 | Sandberg et al. |
| 2017/0116542 | A1 | 4/2017 | Shim et al. |
| 2017/0133576 | A1 | 5/2017 | Marcus et al. |
| 2017/0212860 | A1 | 7/2017 | Naaman et al. |
| 2017/0288281 | A1 | 10/2017 | Chiang et al. |
| 2017/0308804 | A1 | 10/2017 | Wabnig et al. |
| 2018/0069288 | A1 | 3/2018 | Minev et al. |
| 2019/0019098 | A1 | 1/2019 | Przybysz |
| 2019/0042967 | A1 | 2/2019 | Yoscovits et al. |
| 2019/0044047 | A1 | 2/2019 | Elsherbini et al. |
| 2020/0321508 | A1* | 10/2020 | Hart .................. G06N 10/00 |
| 2021/0028345 | A1* | 1/2021 | Hart .................. H01L 39/223 |
| 2021/0408113 | A1* | 12/2021 | Finck .................. H01L 39/223 |

FOREIGN PATENT DOCUMENTS

| | | | |
|---|---|---|---|
| CN | 104584267 | A | 4/2015 |
| CN | 105098125 | A | 11/2015 |
| DE | 202017105268 | U1 | 2/2018 |
| EP | 2529430 | A2 | 12/2012 |
| JP | H07154003 | A | 6/1995 |
| JP | H08279629 | A | 10/1996 |
| JP | 2005260025 | A | 9/2005 |
| JP | 4152778 | B2 | 9/2008 |
| JP | 2011129594 | A | 6/2011 |
| JP | 2019508876 | A | 3/2019 |
| RU | 2609729C1 | A | 2/2017 |
| RU | 2626052C2 | A | 7/2017 |
| WO | 2004070735 | A1 | 8/2004 |
| WO | 2017115160 | A1 | 7/2017 |
| WO | 2017127205 | A1 | 7/2017 |

OTHER PUBLICATIONS

Schmidt et al., "A ballistic graphene superconducting microwave circuit", arxiv.org, Cornell University Library Cornell University Ithaca, NY, Jun. 29, 2018.

Monteiro et al., "Side gate tunable Josephson junctions at the LaA1O_3/SrTiO_3 interface", arxiv.org, Cornell University Library, 201 Olin Library Cornell University Ithaca, NY.

PCT, Written Opinion, PCT/EP2020/057560, PCT/ISA/220, dated Jun. 19, 2020.

International Searching Authority, PCT/EP2020/057560, dated Jun. 19, 2020.

Casparis et al., "Voltage-Controlled Superconducting Quantum Bus", ARXIV 2018.https://arxiv.org/pdf/1802.01327.pdf.

Jay M. Gambetta et al., Building logical qubits in a superconducting quantum computing system, Quantum Information 2017.

R.C. Bialczak et al., Quantum process tomography of a universal entangling gate implemented with Josephson phase qubits, Nature Physics, Apr. 25, 2010.

A. Dewes et al., Characterization of a Two-Transmon Processor with Individual Single-Shot Qubit Readout, Physical Review Letters, Feb. 3, 2012.

R. Barends et al., Superconducting quantum circuits at the surface code threshold for fault tolerance, Nature, Apr. 24, 2014.

L. Dicarlo et al., Demonstration of two-qubit algorithms with a superconducting quantum processor, Nature, Jul. 9, 2009.

Jerry Moy Chow, Quantum Information Processing with Superconducting Qubits, May 2010.

Zhenyi Qi, et al., Controlled-Z gate for transmon qubits coupled by semiconductor juctions, Physical Review, Apr. 23, 2018.

Yuan Cao et al., Unconventional superconductivity in magic-angle graphene superlattices, Nature, Apr. 5, 2018.

Valla Fatemi et al., Electrically tunable low-density superconductivity in a monolayer topological insulator, Science, Nov. 23, 2018.

A.S. Erickson et al., Enhanced superconducting pairing interaction in indium-doped tin telluride, Physical Review, Jan. 30, 2009.

Application No. 2020255132, Examination Report, dated Jul. 7, 2022.

Casparis, et al., Superconducting Gatemon Qubit based on a Proximitized Two-Dimensional Electron Gas, Dec. 8, 2017.

Lee et al., Transport studies of epi-Al/InAs 2DEG systems for required building-blocks in topological superconductor networks, 2017.

Allen, et al., Observation of Electron Coherence and Fabry—Perot Standing Waves at a Graphene Edge, Oct. 18, 2017.

Morpurgo et al., "Hot electron tunable supercurrent", Applied Physics Letters, A I P Publishing LLC, US, vol. 72, No. 8, Feb. 23, 1998.

Pechal et al., "Superconducting switch for fast on-chip routing of quantum microwave fields", arxiv.org, Cornell University Library, 201 Olin Library Cornell University Ithaca, NY, Jun. 3, 2016.

International Searching Authority, PCT/EP2020/057412, P201808414, Jun. 19, 2020.

Application No. 2021-7030845, OA1, Aug. 18, 2022.

Application No. 2021-7030845, OA1 English Translation, Aug. 18, 2022.

Application No. 2020250769, Examination report No. 1 for standard patent application, Aug. 22, 2022.

List of all IBM Related Dockets, 2023.

Morpurgo et al., Hot electron tunable supercurrent, Applied Physics Letters, vol. 72, No. 8, Feb. 23, 1998.

P201900929JP01, Application No. 2021-556354, Receive Rejection, dated Jun. 7, 2023.

P201900929JP01, Application No. 2021-556354, Receive Rejection English Translation, dated Jun. 7, 2023.

P0037075AU, Application No. 2020255132, Notice of acceptance for patent application, dated Mar. 23, 2023.

* cited by examiner

TUNABLE SUPERCONDUCTING RESONATOR FOR QUANTUM COMPUTING DEVICES

TECHNICAL FIELD

The present invention relates generally to a superconductor device, a fabrication method, and fabrication system for tuning qubit coupling in superconducting quantum devices. More particularly, the present invention relates to a device, method, and system for tunable superconducting resonators for quantum computing devices.

BACKGROUND

Hereinafter, a "Q" prefix in a word or phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

Superconducting devices such as qubits are fabricated using superconducting and semiconductor materials in known semiconductor fabrication techniques. A superconducting device generally uses one or more layers of different materials to implement the device properties and function. A layer of material can be superconductive, conductive, semiconductive, insulating, resistive, inductive, capacitive, or have any number of other properties. Different layers of materials may have to be formed using different methods, given the nature of the material, the shape, size or placement of the material, other materials adjacent to the material, and many other considerations.

Superconducting devices are often planar, i.e., where the superconductor structures are fabricated on one plane. A non-planar device is a three-dimensional (3D) device where some of the structures are formed above or below a given plane of fabrication.

A q-processor is implemented as a set of more than one qubits. The qubits are fabricated as a lattice of coplanar devices on a single fabrication plane. Such an implementation of a q-processor is generally accepted as a fault-tolerant quantum architecture known as a Surface Code Scheme (SCS) or Surface Code Architecture (SCA).

SUMMARY

The illustrative embodiments provide a superconducting device, and a method and system of fabrication therefor. An embodiment of a superconducting coupling device includes a resonator structure. In the embodiment, the resonator structure has a first end configured to be coupled to a first device and a second end configured to be coupled to a second device. The embodiment further includes a gate positioned proximal to a portion of the resonator structure. In the embodiment, the gate is configured to receive a gate voltage and vary a kinetic inductance of the portion of the resonator based upon the gate voltage, the varying of the kinetic inductance inducing the resonator structure to vary a strength of coupling between the first device and the second device.

In another embodiment, the varying of the kinetic inductance is a result of the gate varying a superfluid density of the portion of the resonator structure. In another embodiment, the varying of the kinetic inductance induces a varying of a characteristic frequency of the resonator structure. In another embodiment, the varying of the characteristic frequency of the resonator structure enables the varying of the strength of coupling between the first device and the second device.

In another embodiment, at least a portion of the resonator structure is formed of a superconducting material comprising magic angle twisted bilayer graphene, $WTe_2$, $Sn_{1-\delta-x}In_xTe$, or another suitable material. In another embodiment, the gate is formed of a metal material or of a superconducting material.

In another embodiment, the first device is capacitively coupled to the first end of the resonator structure, and the second device is capacitively coupled to the second end of the resonator structure.

Another embodiment further includes a ground plane connected to the resonator structure. In another embodiment, the ground plane is connected to the resonator structure by a shunt portion of the resonator structure.

Another embodiment further includes a substrate structure, wherein the resonator structure is disposed upon a surface of the substrate structure. Another embodiment further includes an insulator disposed upon the resonator structure, wherein the gate is disposed upon the insulating structure.

Another embodiment further includes a ground plane disposed upon the surface of the substrate proximate to the resonator structure.

In another embodiment, the first device is a first qubit and the second device is a second qubit.

In another embodiment, the first device is a qubit and the second device includes readout measurement circuitry of a quantum computing device.

In another embodiment, wherein the first device is a first transmon and the second device is a second transmon, and the resonator structure and the gate provide tunable coupling between the first transmon and the second transmon.

An embodiment includes a fabrication method for fabricating the superconducting device.

An embodiment includes a fabrication system for fabricating the superconducting device.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

The illustrative embodiments used to describe the invention generally address and solve the above-described problems and other related problems by providing a tunable superconducting resonator for quantum computing devices. The illustrative embodiments also provide a fabrication method and system for fabricating a tunable superconducting resonator for quantum computing devices.

Figure 1:
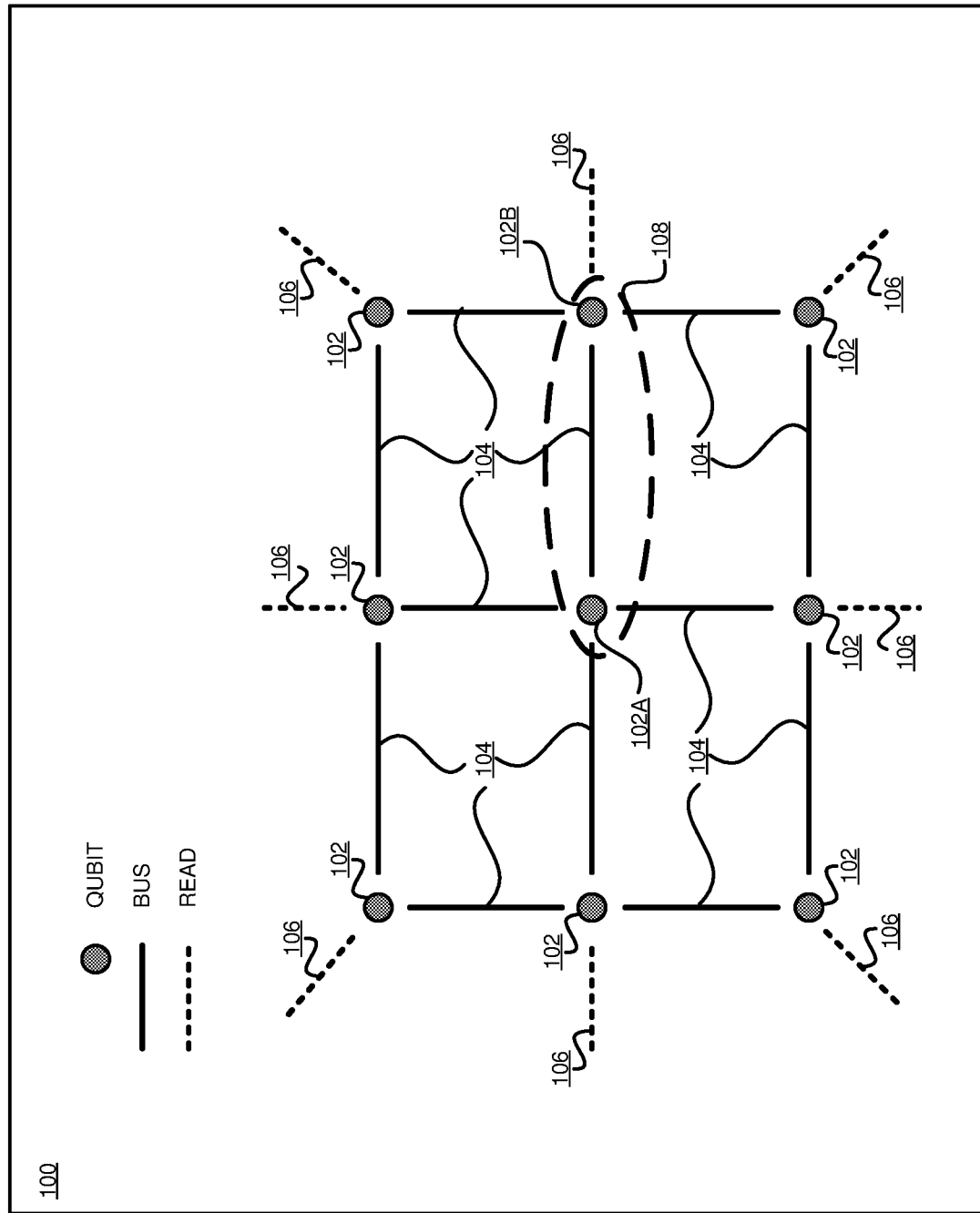
FIG. 1 depicts an example Surface Code Architecture (SCA) illustrating a problem that can be solved using an illustrative embodiment.

FIG. 1 depicts an example Surface Code Architecture (SCA) illustrating a problem that can be solved using an illustrative embodiment. Superconducting qubit architectures such as SCA 100 arrange a number of qubits 102, 102A, and 102B in a lattice formation on a planar two-dimensional (2D) grid. The qubits are coupled with each other and communicate using resonant lines 104 (also known as a "bus"). The quantum state of a qubit 102 is read using read lines 106 capacitively coupled to particular qubits.

Typically, read lines 106 are resonant lines in which the qubit state of a particular qubit is measured using dispersive readout. Dispersive readout uses dispersive interaction with a resonator in which the interaction results in a dispersive shift that causes the frequency of the resonator to change depending on the state of the qubit. The resonator frequency is interrogated with a microwave pulse, typically at a frequency near the midpoint of the resonant frequencies corresponding to the ground and excited states. The phase and amplitude of the reflected signal are used to distinguish the state of the qubit.

However, existing architectures using dispersive readout are subject to microwave cross-talk and/or frequency collisions between qubits resulting in performance degradation in quantum state measurements and correspondingly reduced performance of quantum computers.

In order to address the above problems with existing architectures, attempts have been made to develop architectures to allow tuning of coupling between qubits. Experimentally, tuning qubit coupling has previously relied upon controlling circuit elements with magnetic flux. However, these flux-tunable qubits suffer from several disadvantages including reduced coherence times due to flux-noise, the necessity of fine tuning of magnetic flux, their susceptibility to on-chip cross-talk (e.g., as high as 30%), heating due to current needed to generate the flux, and degradation of qubit performance due to shortened coherence time. Some recent activity has focused on developing voltage-controlled tuning of qubit coupling. One recent approach toward developing voltage-controlled tuning has included a proposal to controllably short two grounded transmons through a gate-tuned semiconductor switch. Another recent approach uses a voltage-controlled switch based on a semiconductor nanowire to controllably ground one end of a superconducting cavity to change coupling of grounded gatemons.

A solution is needed to provide for tunable superconducting resonators for quantum computing devices to address the above-described problems related to qubit coupling in order to provide advantages such as reduced microwave cross-talk and/or frequency collisions between qubits. For example, such a solution would enable controlling the coupling between qubit 102A and qubit 102B in order to reduce or eliminate microwave cross-talk and/or frequency collisions between qubit 102A and qubit 102B during readout or during application of control pulses to the qubits.

An embodiment provides a tunable coupling architecture for quantum computing devices. An embodiment includes a gate-tunable superconducting resonator in which a voltage applied to a proximal gate tunes the superfluid density and kinetic inductance in part or all of a resonator structure coupled to qubits. Tuning the kinetic inductance results in tuning of a characteristic frequency of the resonator enabling adjustment of a strength of coupling between qubits to allow, for example, an adjustment from a weak coupling between qubits to a strong coupling between qubits.

Kinetic inductance is a manifestation of the inertial mass of mobile charge carriers as an equivalent inductance, and is observed in high carrier mobility conductors such as superconductors. Kinetic inductance is inversely proportional to carrier density (or superfluid density) such that as kinetic inductance increases, carrier density decreases.

In the embodiment, varying gate voltage of the metal gate results in a varying of the charge density. Varying of the charge density results in varying of the kinetic inductance and a corresponding varying of the characteristic frequency of the resonator coupling the qubits. Variation of the characteristic frequency of the resonator results in a variation of the strength of coupling between the qubits.

One or more embodiments provide for gradually tunable coupling between nearest-neighbor qubits via adjustment of the gate voltage. Another embodiment provides for multiplexed readout from qubits through tunable readout resonators. Still another embodiment provides for the ability to shut off qubits with unwanted transition frequencies by shutting off or reducing the coupling of a qubit having unwanted transition frequencies with one or more other qubits. One or more embodiments provide for the use of tunable superconducting resonators to provide a novel quantum gate hardware approach with faster gates and tunable coupling strength between qubits.

Another embodiment provides a fabrication method for the tunable coupling resonator, such that the method can be implemented as a software application. The application implementing a fabrication method embodiment can be configured to operate in conjunction with an existing superconducting fabrication system—such as a lithography system.

For the clarity of the description, and without implying any limitation thereto, the illustrative embodiments are described using an example number of qubits arranged in a lattice. An embodiment can be implemented with a different number of qubits, different arrangements in a lattice, a superconducting device other than a qubit, types of qubits not based on superconductors, or some combination thereof, within the scope of the illustrative embodiments. An embodiment can be implemented to similarly improve other superconducting fabrications where a tunable coupling to a superconducting element is desired.

Furthermore, a simplified diagram of the example tunable coupling resonator is used in the figures and the illustrative embodiments. In an actual fabrication of a tunable coupling resonator, additional structures that are not shown or described herein, or structures different from those shown and described herein, may be present without departing the scope of the illustrative embodiments. Similarly, within the scope of the illustrative embodiments, a shown or described structure in the example tunable coupling resonator may be fabricated differently to yield a similar operation or result as described herein.

Differently shaded portions in the two-dimensional drawing of the example structures, layers, and formations are intended to represent different structures, layers, materials, and formations in the example fabrication, as described herein. The different structures, layers, materials, and formations may be fabricated using suitable materials that are known to those of ordinary skill in the art.

A specific shape, location, position, or dimension of a shape depicted herein is not intended to be limiting on the illustrative embodiments unless such a characteristic is expressly described as a feature of an embodiment. The shape, location, position, dimension, or some combination thereof, are chosen only for the clarity of the drawings and the description and may have been exaggerated, minimized, or otherwise changed from actual shape, location, position, or dimension that might be used in actual lithography to achieve an objective according to the illustrative embodiments.

Furthermore, the illustrative embodiments are described with respect to a specific actual or hypothetical superconducting device, e.g., a qubit, only as an example. The steps described by the various illustrative embodiments can be adapted for fabricating a variety of tunable coupling resonators in a similar manner, and such adaptations are contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

The illustrative embodiments are described with respect to certain types of materials, electrical properties, structures, formations, layers orientations, directions, steps, operations, planes, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The illustrative embodiments are described using specific designs, architectures, layouts, schematics, and tools only as examples and are not limiting to the illustrative embodiments. The illustrative embodiments may be used in conjunction with other comparable or similarly purposed designs, architectures, layouts, schematics, and tools.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
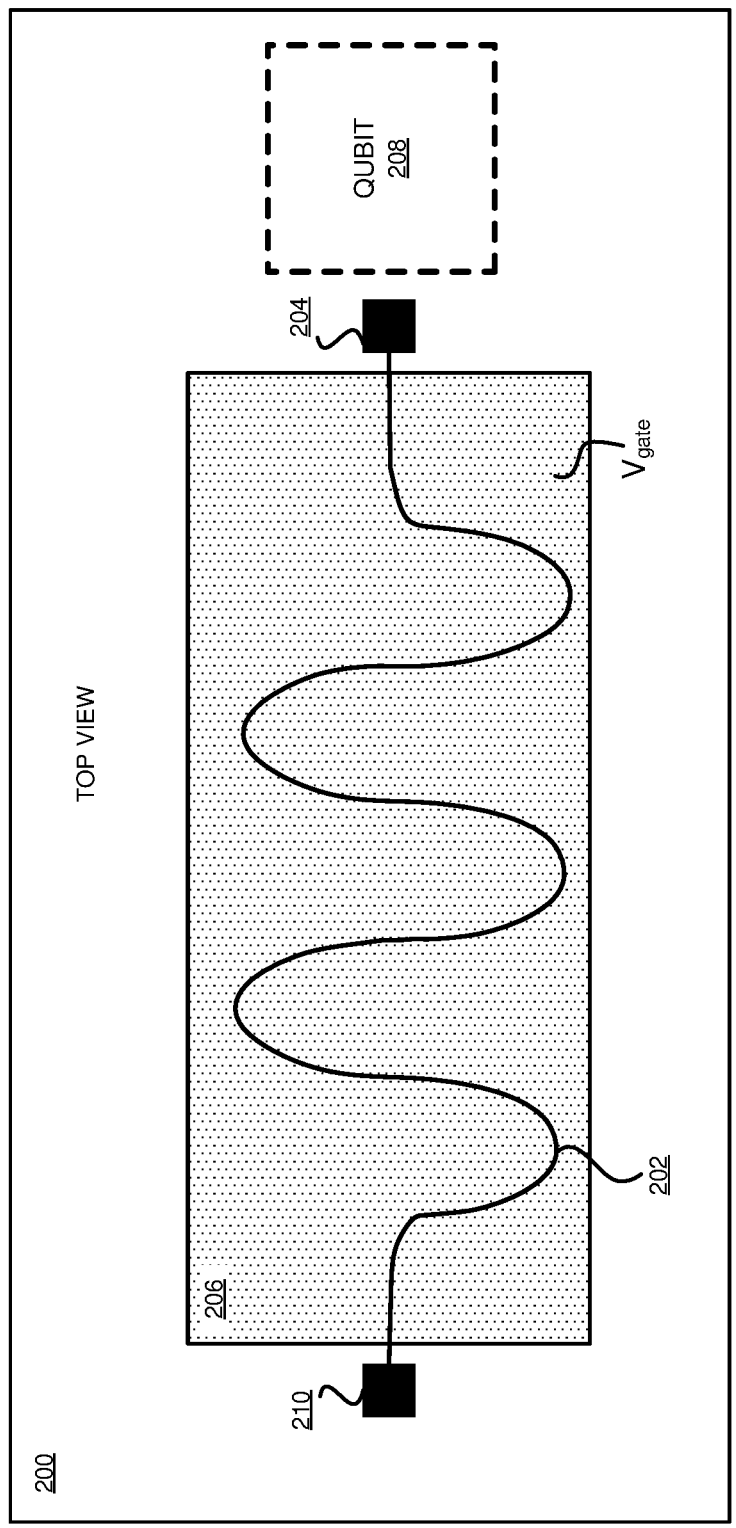
FIG. 2 depicts an example gate-tunable resonator in accordance with an illustrative embodiment.

With reference to FIG. 2, this figure depicts an example gate-tunable resonator in accordance with an illustrative embodiment. Top view 200 depicts a tunable superconducting resonator structure having a resonator center conductor 202 constructed of a superconducting material connected to a coupling pad 204 at one end and a ground layer 210 at another end, and a metal gate 206 proximal to resonator 202.

In the particular embodiment illustrated in FIG. 2, resonator center conductor 202 is shown in a meandering configuration. In other particular embodiments, resonator center conductor 202 may be in a straight configuration or any other suitable resonator configuration. In the illustrated embodiment, metal gate 206 is of a planar rectangular shape and positioned below and proximate to substantially the entire length of resonator center conductor 202. In other particular embodiments, metal gate 206 may be of any suitable shape, size, or configuration. In other embodiments, other gate and qubit structures may be used, and the gate structure may not gate the entire resonator center conductor 202 but may only gate a portion of the resonator center conductor 202. In other embodiments, more than one qubit may be capacitively coupled to the resonator center conductor 202 at different locations along its length. In one or more embodiments, resonator center conductor 202 and metal gate 206 are separated by an insulator material or a vacuum. In an embodiment, metal gate 206 may overlap only part of the resonator instead of substantially its entire length.

In some embodiments, the ground layer 210 may be constructed in such a way that the resonator comprises a coplanar waveguide. In this geometry, the ground plane is separated from the resonator center conductor 202 on either side by a distance which does not vary along the length of the resonator. The dimensions are typically guided by design specifications for a transmission line with 50 ohm impedance in the frequency regime of 1 MHz-20 GHz. In the embodiment illustrated in FIG. 2, this ground plane geometry is not shown for clarity.

In particular embodiments, possible superconducting materials of which resonator center conductor 202, coupling pad 204, gate 206, or ground layer 210 may be formed include one or more of aluminum, indium, niobium, niobium nitride, niobium titanium nitride, niobium diselenide, tantalum, titanium, or molybdenum rhenium. In particular embodiments, possible metallic or conductive gate materials of which metal gate 206 may be formed include gold, platinum, palladium, gold alloys (e.g. palladium gold), copper, or graphite. It should be understood that the foregoing is a non-exhaustive list of possible superconducting materials and metallic materials, and in other embodiments other suitable superconducting materials or metallic materials may be used. In some embodiments, the resonator may only be partially composed of a gate-tunable superconductor material and other portions of the resonator may be composed materials that are not gate-tunable. Coupling pad 204 is configured to capacitively couple a qubit 208 to resonator center conductor 202.

In an embodiment, a gate voltage $V_{gate}$ is applied to metal gate 206 to cause a controllable variation in carrier density within resonator center conductor 202, and thereby further cause a variation in kinetic inductance of resonator center conductor 202 as the kinetic inductance $L_k$ of resonator center conductor 202 is inversely proportional to the carrier density $n_s$. The variation in kinetic inductance $L_k$ further causes a change in the characteristic frequency of the resonator comprising center conductor 202, which further changes the strength of coupling between qubit 208 and the other device. Accordingly, the gate voltage $V_{gate}$ is configurable to tune the kinetic inductance $L_k$ and hence capable of detuning the resonator comprising center conductor 202 to change the strength of coupling between qubit 208 and the other device.

Figure 3:
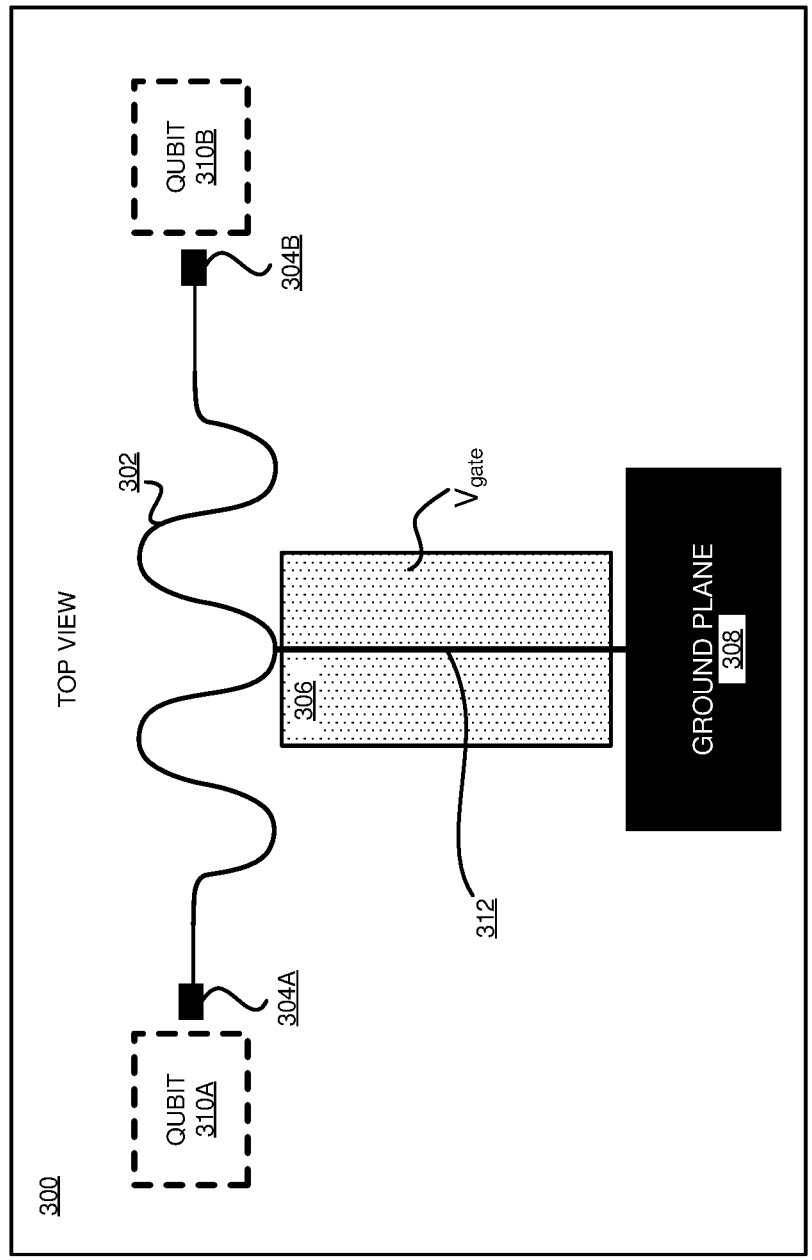
FIG. 3 depicts an example shunted gate-tunable resonator in accordance with an illustrative embodiment.

With reference to FIG. 3, this figure depicts an example shunted gate-tunable resonator in accordance with an illustrative embodiment. Top view 300 depicts a shunted tunable superconducting resonator structure having a resonator center conductor 302 constructed of a superconducting material connected to a first coupling pad 304A at one end and a second coupling pad 304B at another end. Resonator center conductor 302 is connected to a shunt portion 312 coupling resonator center conductor 302 to a ground plane 308. In an embodiment, resonator center conductor 302 and shunt portion 312 may be composed of a continuous piece of the same superconducting material. A metal gate 306 is proximal to the shunt portion 312. In a particular embodiment, ground plane 308 is a superconducting ground plane formed of a superconducting material. In other embodiments, other gate and qubit structures may be used, and the gate structure may gate all or part of the resonator center conductor 302 and/or all or part of the shunt 312.

In some embodiments, the ground layer 308 may be constructed in such a way that the resonator comprises a coplanar waveguide. In this geometry, the ground plane is separated from the resonator center conductor 302, as well as the shunt 312, on either side by a distance which does not vary along the length of the resonator. The dimensions are typically guided by design specifications for a transmission line with 50 ohm impedance in the frequency regime of 1 MHz-20 GHz. In the embodiment illustrated in FIG. 3, this ground plane geometry is not shown for clarity.

In the particular embodiment illustrated in FIG. 3, resonator center conductor 302 is shown in a meandering configuration. In other particular embodiments, resonator center conductor 302 may be in a straight configuration or any other suitable resonator configuration. In the illustrated embodiment, metal gate 306 is of a planar rectangular shape and positioned proximate to substantially the entire length of the shunt portion 312. In other particular embodiments, metal gate 306 may be of any suitable shape, size, or configuration. In one or more embodiments, resonator center conductor 302 and metal gate 306 are separated by an insulator material or a vacuum.

First coupling pad 304A is configured to capacitively couple a first qubit 310A to resonator center conductor 302, and second coupling pad 304B is configured to capacitively couple a second qubit 310B to resonator center conductor 302. In some embodiments, first coupling pad 304A is configured to capacitively couple a qubit 310A to resonator center conductor 302, and second coupling pad 304B is configured to capacitively couple to another device such as readout measurement circuitry. In some embodiments, first coupling pad 304A is configured to capacitively couple a qubit 310A to resonator center conductor 302, and second coupling pad 304B couples directly to readout measurement circuitry, for example using a wirebond or bump bond.

In an embodiment, a gate voltage $V_{gate}$ is applied to metal gate 306 to cause a controllable variation in carrier density within resonator center conductor 302, and thereby further cause a variation in kinetic inductance of resonator center conductor 302 as the kinetic inductance $L_k$ of resonator center conductor 302 is inversely proportional to the carrier density $n_s$. The variation in kinetic inductance $L_k$ further causes a change in the characteristic frequency of the resonator comprising center conductor 302, which further changes the strength of coupling between first qubit 310A and second qubit 310B. Accordingly, the gate voltage $V_{gate}$ is configurable to tune the kinetic inductance $L_k$ and hence capable of detuning the resonator comprising center conductor 302 to change the strength of coupling between first qubit 310A and second qubit 310B.

Figure 4:
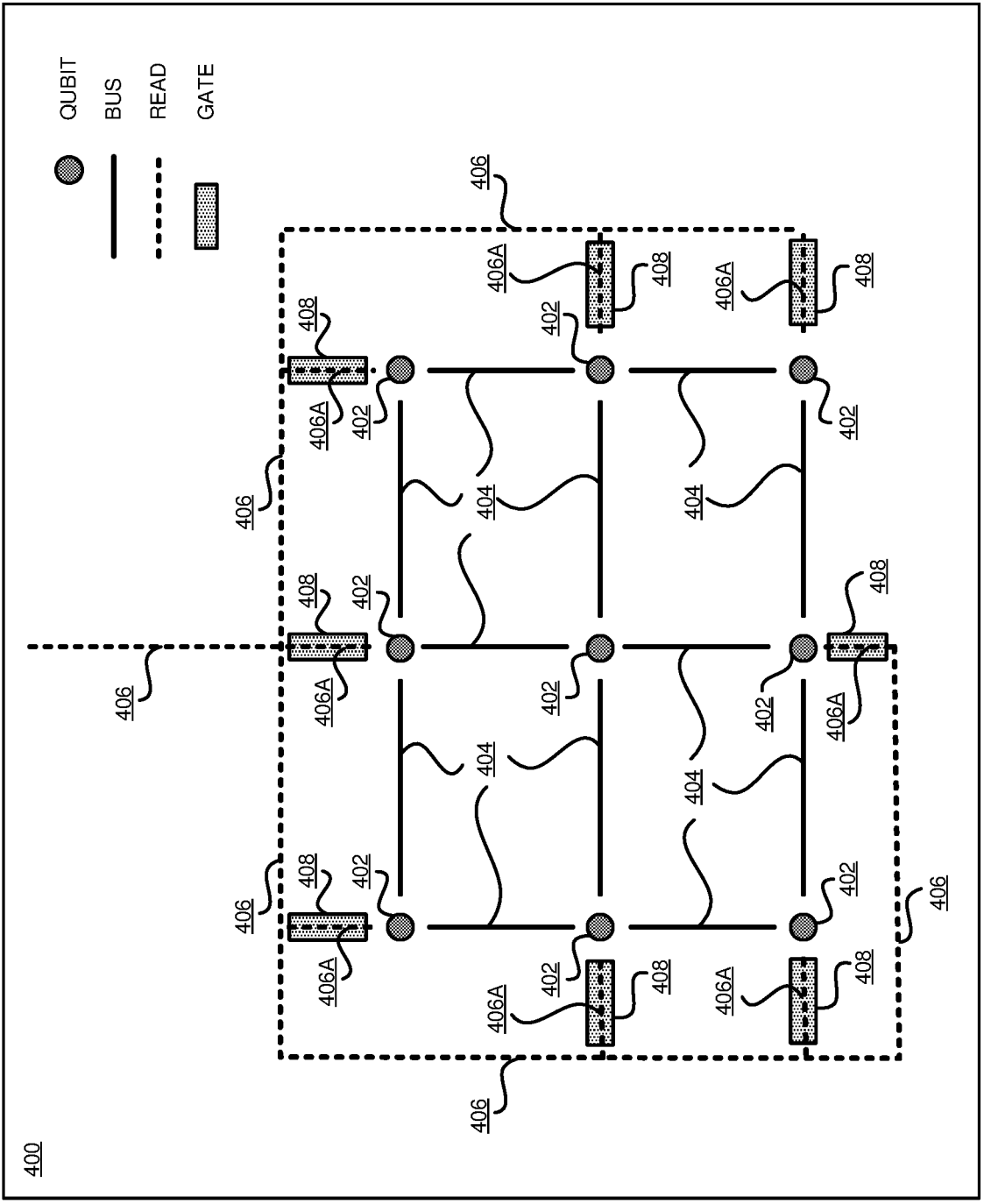
FIG. 4 depicts an example implementation of tuning superconducting resonators in an SCA arrangement in accordance with an illustrative embodiment.

With reference to FIG. 4, this figure depicts an example implementation of tuning superconducting resonators in an SCA arrangement accordance with an illustrative embodiment. Top view 400 depicts a number of qubits 402 in a lattice formation on a planar two-dimensional (2D) grid. The qubits are coupled with each other and communicate using resonant lines 404 (also known as a "bus"). The quantum state of a qubit 102 is read using read lines 406, 406A capacitively coupled to particular qubits. Each of read lines 406A further include a metal gate 408 disposed proximate thereto to form a gate-tunable resonator such as described herein with respect to various embodiments.

In the illustrated embodiment, each of read lines 406A and the corresponding metal gate 408 forming a gate-tunable resonator are configured to receive an individually controllable gate voltage to allow controlled coupling and decoupling of a particular qubit 402 from a read line 406. In one or more embodiments, the individually gated sections of gate-tunable resonators provide for the capability of multiplexed readout of qubits 406 through tunable readout resonators.

Figure 5:
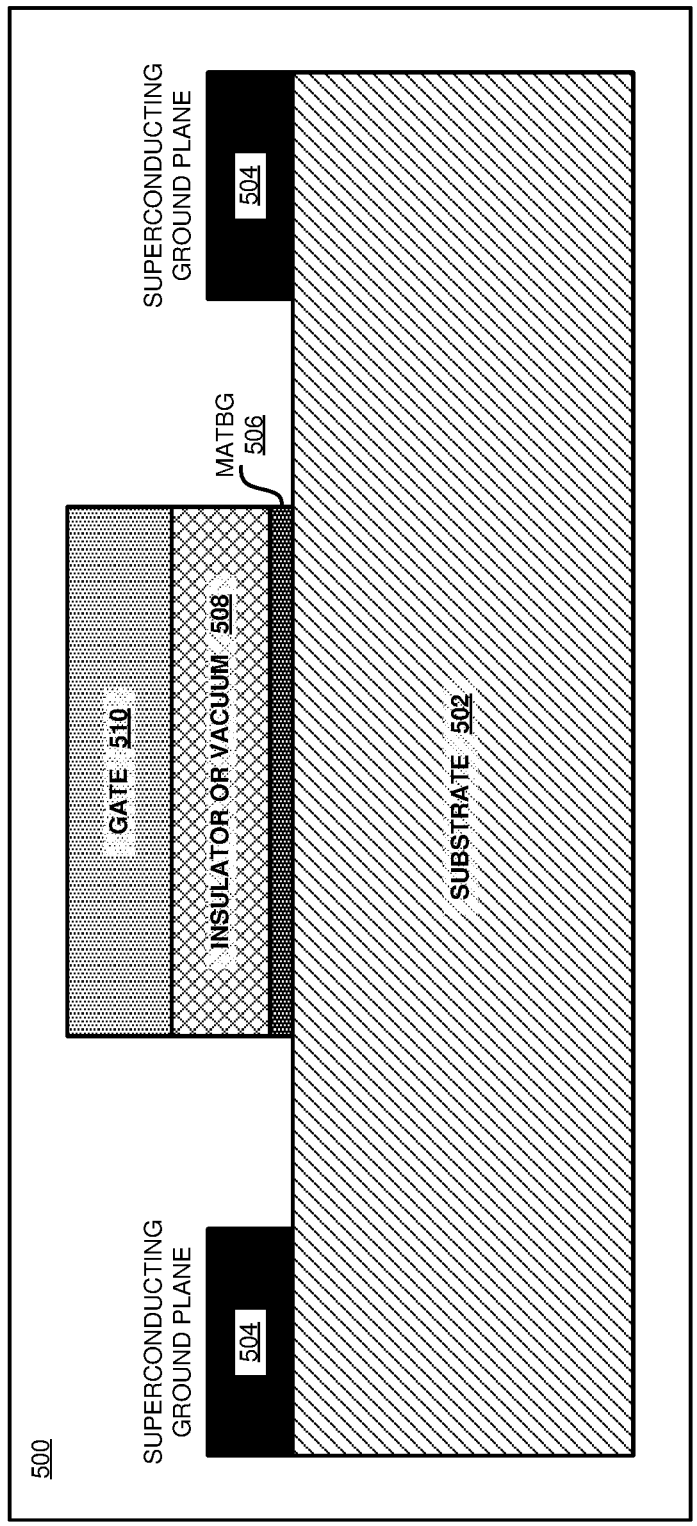
FIG. 5 depicts a cross-section view of a gate-tunable resonator structure according to an illustrative embodiment.

With reference to FIG. 5, this figure depicts a cross-section view of a gate-tunable resonator structure 500 according to an illustrative embodiment. Structure 500 includes a substrate structure 502 having superconducting ground plane portions 504 formed on a surface (e.g., a top surface) of substrate structure 502. In particular embodiments, substrate structure 502 can be formed of any suitable substrate material, such as silicon (Si) or sapphire. Structure 500 further includes a resonator center conductor 506 disposed on the surface of substrate structure 502 proximate to superconducting ground plane portions 504. Together the resonator center conductor 506 and superconducting ground plane portions 504 comprise a coplanar waveguide resonator. In some embodiments, the dimensions and location of components in structure 500 may be designed to account for capacitance due to the gate 510.

In the embodiment illustrated in FIG. 5, resonator center conductor 506 is formed of magic-angle twisted bilayer graphene (MATBG) material as a superconducting material. In particular embodiments, the MATBG material is tuned to a superconducting critical temperature $T_c$ between 0 kelvin (K) and 1.7 K.

Structure 500 further includes an insulator layer or vacuum region 508 separating resonator center conductor 506 and a metal gate 510. In one or more embodiments, structure 500 is an example of a gate-tunable resonator such as those described with respect to FIGS. 2-4. In one or more embodiments, resonator center conductor 506 is capacitively coupled between two superconducting devices such as first qubit 310A and second qubit 310B of FIG. 3. In some embodiments, the structure 500 represents a cross-section view through structure 202, structure 302, and/or structure 306.

In an embodiment, a gate voltage $V_{gate}$ is applied to metal gate 510 to cause a controllable variation in carrier density within resonator center conductor 506, and thereby further cause a variation in kinetic inductance of resonator center conductor 506 as the kinetic inductance $L_k$ of resonator center conductor 506 is inversely proportional to the carrier density $n_s$. The variation in kinetic inductance $L_k$ further causes a change in the characteristic frequency of the resonator in structure 500, which further changes the strength of coupling between first qubit 310A and second qubit 310B. Accordingly, the gate voltage $V_{gate}$ is configurable to tune the kinetic inductance $L_k$ and hence capable of tuning the resonator in structure 500 to change the strength of coupling between first qubit 310A and second qubit 310B.

Figure 6:
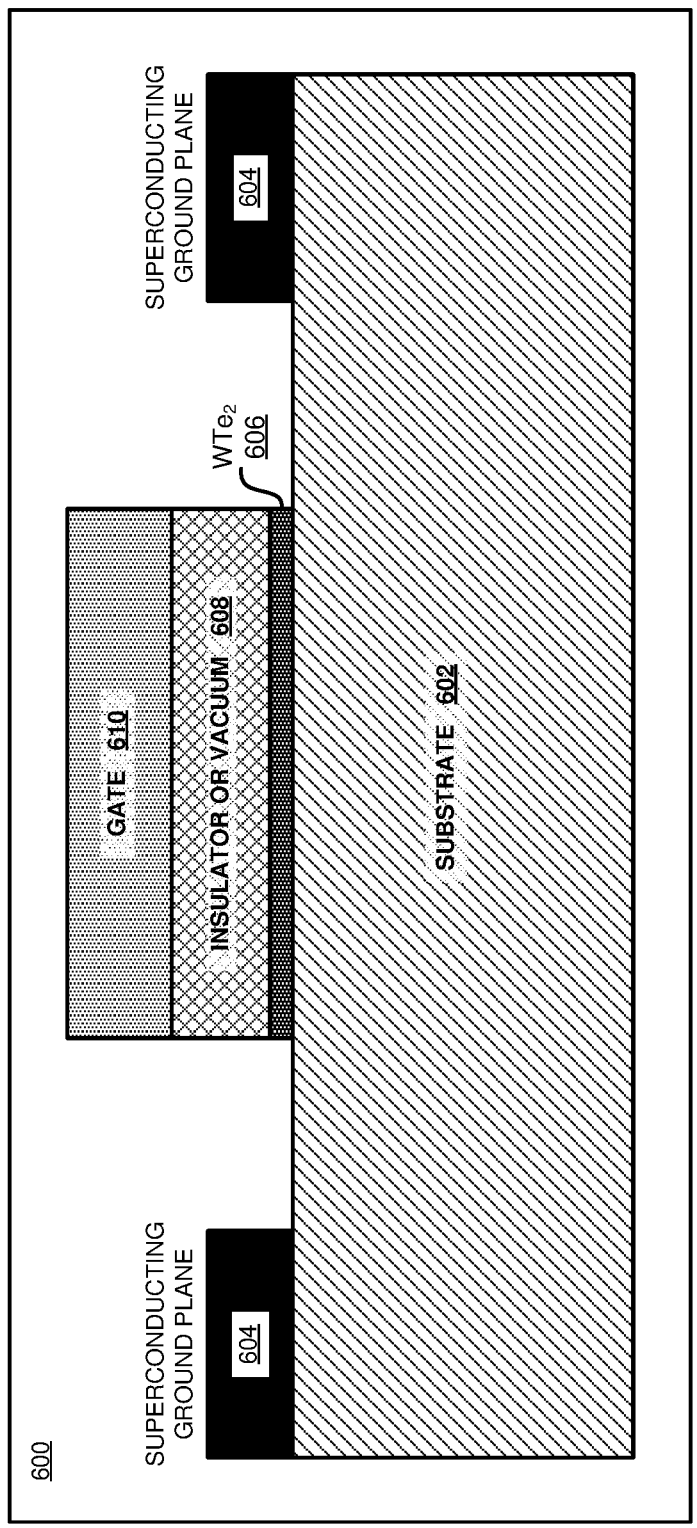
FIG. 6 figure depicts a cross-section view of a gate-tunable resonator structure according to another illustrative embodiment.

With reference to FIG. 6, this figure depicts a cross-section view of a gate-tunable resonator structure 600 according to another illustrative embodiment. Structure 600 includes a substrate structure 602 having superconducting ground plane portions 604 formed on a surface (e.g., a top surface) of substrate structure 602. In particular embodiments, substrate structure 602 can be formed of any suitable substrate material, such as silicon (Si) or sapphire. Structure 600 further includes a resonator center conductor 606 formed of a superconducting material disposed on the surface of substrate structure 602 proximate to superconducting ground plane portions 604. Together the resonator center conductor 606 and superconducting ground plane portions 604 comprise a coplanar waveguide resonator. In some embodiments, the dimensions and location of components in structure 600 may be designed to account for capacitance due to the gate 610.

In the embodiment illustrated in FIG. 6, resonator center conductor 606 is formed of tungsten ditelluride ($WTe_2$) material as a superconducting material. In particular embodiments, the $WTe_2$ material is tuned to a superconducting critical temperature $T_c$ between 0 K and 0.61 K.

Structure 600 further includes an insulator layer or vacuum region 608 separating resonator center conductor 606 and a metal gate 610. In one or more embodiments, structure 600 is an example of a gate-tunable resonator such as those described with respect to FIGS. 2-4. In one or more embodiments, resonator center conductor 606 is capacitively coupled between two superconducting devices such as first qubit 310A and second 310B of FIG. 3. In some embodiments, structure 600 represents a cross-section view through structure 202, structure 302, and/or structure 306.

In an embodiment, a gate voltage $V_{gate}$ is applied to metal gate 610 to cause a controllable variation in carrier density within resonator center conductor 606, and thereby further cause a variation in kinetic inductance of resonator center conductor 606 as the kinetic inductance $L_k$ of resonator center conductor 606 is inversely proportional to the carrier density $n_s$. The variation in kinetic inductance $L_k$ further causes a change in the characteristic frequency of the resonator in structure 600, which further changes the strength of coupling between first qubit 310A and second qubit 310B. Accordingly, the gate voltage $V_{gate}$ is configurable to tune the kinetic inductance $L_k$ and hence capable of tuning the resonator in structure 600 to change the strength of coupling between first qubit 310A and second qubit 310B.

Figure 7:
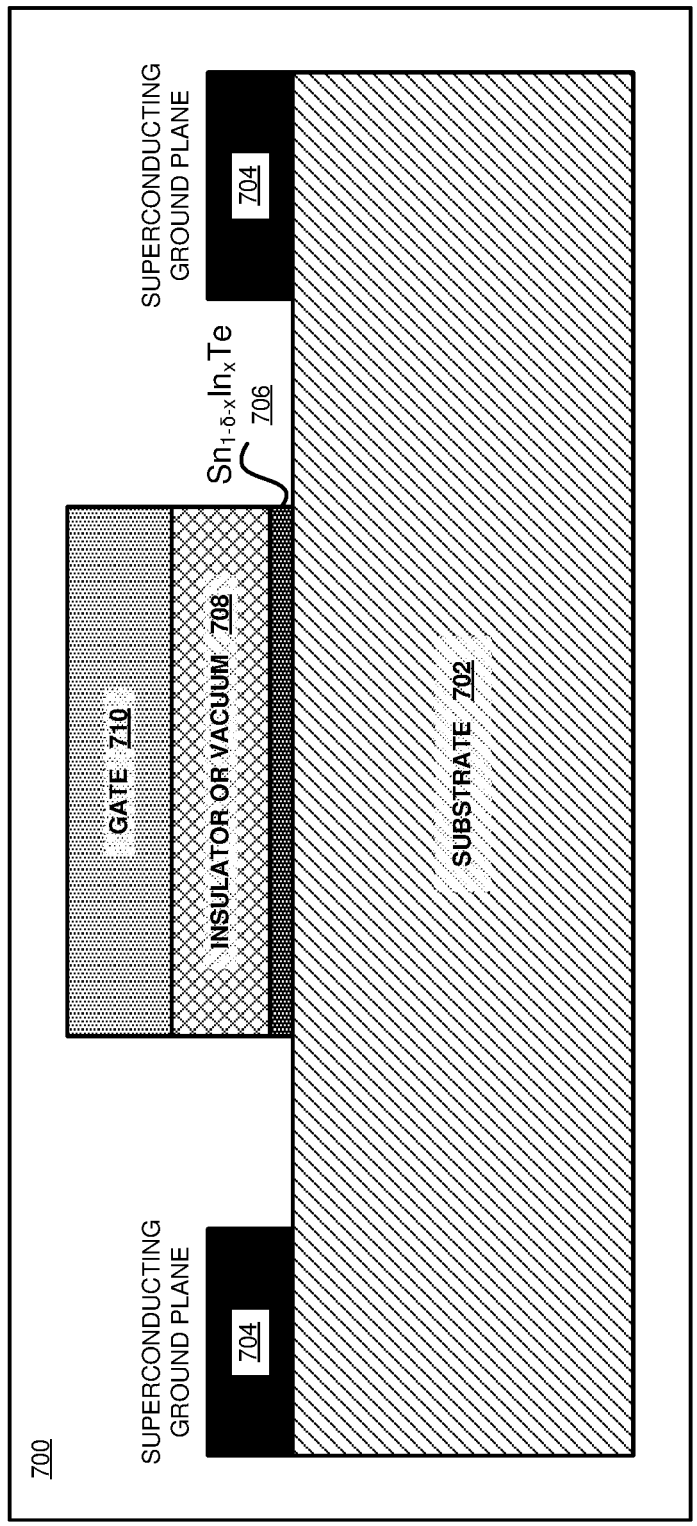
FIG. 7 depicts a cross-section view of a gate-tunable resonator structure according to another illustrative embodiment.

With reference to FIG. 7, this figure depicts a cross-section view of a gate-tunable resonator structure 700 according to another illustrative embodiment. Structure 700 includes a substrate structure 702 having superconducting ground plane portions 704 formed on a surface (e.g., a top surface) of substrate structure 702. In particular embodiments, substrate structure 702 can be formed of any suitable substrate material, such as silicon (Si) or sapphire. Structure 700 further includes a resonator center conductor 706 formed of a superconducting material disposed on the surface of substrate structure 702 proximate to superconducting ground plane portions 704. Together the resonator center conductor 706 and superconducting ground plane portions 704 comprise a coplanar waveguide resonator. In some embodiments, the dimensions and location of components in structure 700 may be designed to account for capacitance due to the gate 710.

In the embodiment illustrated in FIG. 7, resonator center conductor 706 is formed of a thin layer of $Sn_{1-\delta-x}In_xTe$ material as a superconducting material.

Structure 700 further includes an insulator layer or vacuum region 708 separating resonator center conductor 706 and a metal gate 710. In one or more embodiments, structure 700 is an example of a gate-tunable resonator such as those described with respect to FIGS. 2-4. In one or more embodiments, resonator center conductor 706 is capacitively coupled between two superconducting devices such as first qubit 310A and second 310B of FIG. 3. In some embodiments, the structure 700 represents a cross-section view through structure 202, structure 302, and/or structure 306.

In an embodiment, a gate voltage $V_{gate}$ is applied to metal gate 710 to cause a controllable variation in carrier density within resonator center conductor 706, and thereby further cause a variation in kinetic inductance of resonator center conductor 706 as the kinetic inductance $L_k$ of resonator center conductor 706 is inversely proportional to the carrier density $n_s$. The variation in kinetic inductance $L_k$ further causes a change in the characteristic frequency of the resonator in structure 700, which further changes the strength of coupling between first qubit 310A and second qubit 310B. Accordingly, the gate voltage $V_{gate}$ is configurable to tune the kinetic inductance $L_k$ and hence capable of tuning the resonator in structure 700 to change the strength of coupling between first qubit 310A and second qubit 310B.

Figure 8:
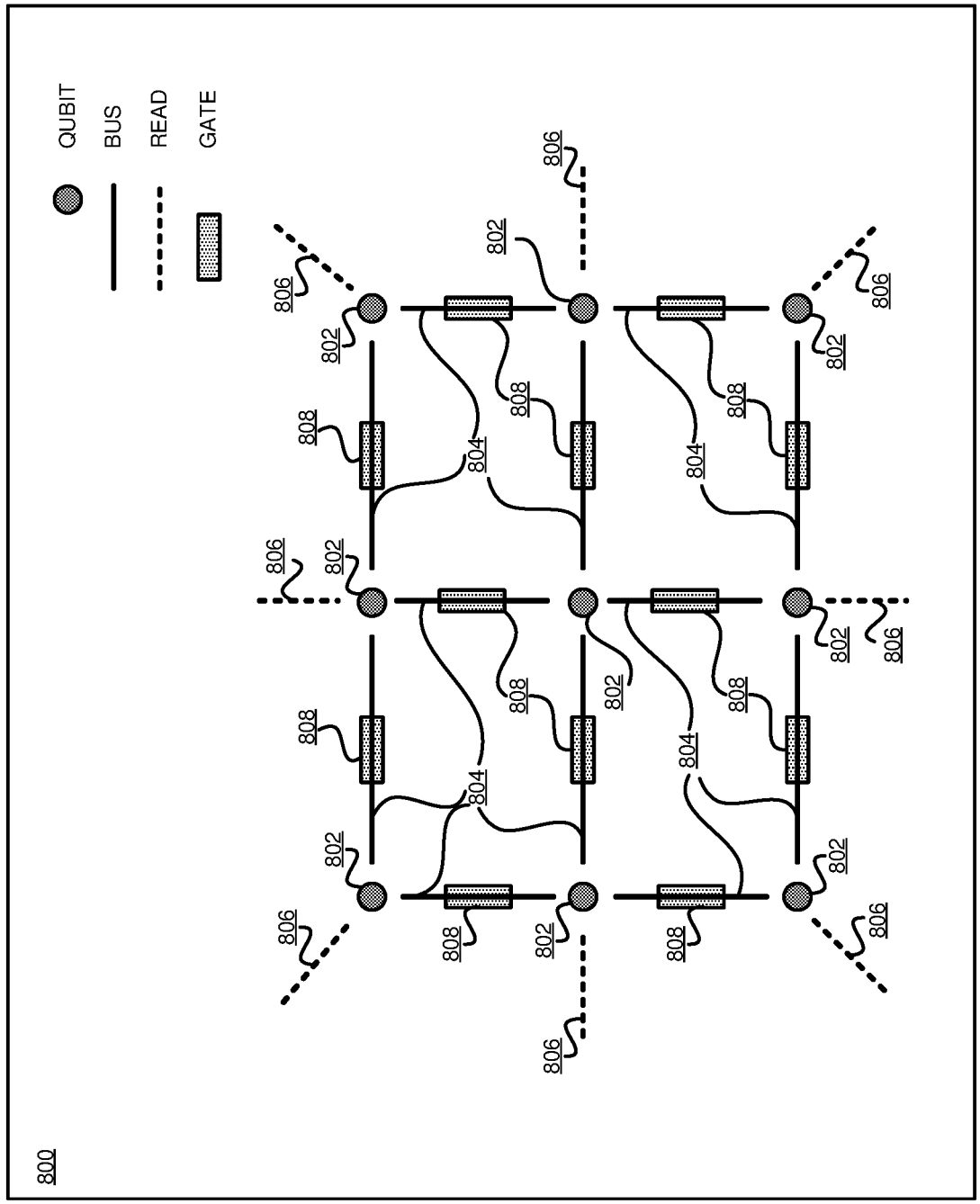
FIG. 8 depicts an example implementation of tuning superconducting resonators in an SCA arrangement accordance with an illustrative embodiment.

With reference to FIG. 8, this figure depicts an example implementation of tuning superconducting resonators in an SCA arrangement accordance with an illustrative embodiment. Top view 800 depicts a number of qubits 802 in a lattice formation on a planar two-dimensional (2D) grid. The quantum state of a qubit 802 is read using read lines 806 capacitively coupled to particular qubits. The qubits are coupled with each other and communicate using resonant lines 804 (also known as a "bus"). Each of resonant lines 804 further include a gate 808 disposed proximate thereto to form a gate-tunable resonator such as described herein with respect to various embodiments.

In the illustrated embodiment, each of resonant lines 804 and the corresponding gate 808 forming a gate-tunable resonator are configured to receive an individually controllable gate voltage to allow controlled coupling and decoupling of pairs of qubits 802. In one or more embodiments, the individually gated sections of gate-tunable resonators provide for the capability of gradually tuning coupling between nearest-neighbor qubits. In one or more embodiments, the individually gated sections of gate-tunable resonators provide for the capability of shutting off qubits with unwanted transition frequencies. In one or more embodiments, the individually gated sections of gate-tunable resonators provide for a novel quantum gate hardware approach with faster gates and tunable coupling strength between qubits.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A superconducting coupling device comprising:
a resonator structure, the resonator structure having an insulator layer, a first end capacitively coupled to a first device, and a second end capacitively coupled to a second device; and
a gate disposed on the insulator layer, the gate configured to receive a gate voltage and vary a kinetic inductance of a portion of the resonator structure based upon the gate voltage, the varying of the kinetic inductance inducing the resonator structure to vary a strength of coupling between the first device and the second device.

2. The superconducting coupling device of claim 1, wherein the varying of the kinetic inductance is a result of the gate varying a superfluid density of the portion of the resonator structure.

3. The superconducting coupling device of claim 1, wherein the varying of the kinetic inductance induces a varying of a characteristic frequency of the resonator structure.

4. The superconducting coupling device of claim 3, wherein the varying of the characteristic frequency of the resonator structure enables the varying of the strength of coupling between the first device and the second device.

5. The superconducting coupling device of claim 1, wherein at least a portion of the resonator structure is formed of a superconducting material comprising magic angle twisted bilayer graphene, $WTe_2$, or $Sn_{1-\delta-x}In_xTe$.

6. The superconducting coupling device of claim 1, wherein the gate is formed of a metal material or of a superconducting material.

7. The superconducting coupling device of claim 1, further comprising a ground plane connected to the resonator structure.

8. The superconducting coupling device of claim 7, wherein the ground plane is connected to the resonator structure by a shunt portion of the resonator structure.

9. The superconducting coupling device of claim 1, further comprising a substrate structure, wherein the resonator structure is disposed upon a surface of the substrate structure.

10. The superconducting coupling device of claim 9, further comprising a ground plane disposed upon the surface of the substrate.

11. The superconducting coupling device of claim 1, wherein the first device is a first qubit and the second device is a second qubit.

12. The superconducting coupling device of claim 1, wherein the first device is a qubit and the second device includes readout measurement circuitry of a quantum computing device.

13. The superconducting coupling device of claim 1, wherein the first device is a first transmon and the second device is a second transmon, and wherein the resonator structure and the gate provide tunable coupling between the first transmon and the second transmon.

14. A superconductor fabrication system comprising a lithography component, the superconductor fabrication system when operated on a die to fabricate a superconductor device performing operations comprising:

coupling, capacitively, a first end of a resonator structure to a first device;

coupling, capacitively, a second end of the resonator structure to a second device;

supporting a gate by an insulator layer disposed on a portion of the resonator structure;

receiving a gate voltage by the gate; and varying a kinetic inductance of the portion of the resonator based upon the gate voltage, the varying of the kinetic inductance inducing the resonator structure to vary a strength of coupling between the first device and the second device.

15. The superconductor fabrication system of claim 14, wherein the varying of the kinetic inductance is a result of the gate varying a superfluid density of the portion of the resonator structure.

16. The superconductor fabrication system of claim 14, wherein the varying of the kinetic inductance induces a varying of a characteristic frequency of the resonator structure.

17. The superconductor fabrication system of claim 16, wherein the varying of the characteristic frequency of the resonator structure enables the varying of the strength of coupling between the first device and the second device.

18. The superconductor fabrication system of claim 14, wherein at least a portion of the resonator structure is formed of a superconducting material comprising magic angle twisted bilayer graphene, $WTe_2$, or $Sn_{1-\delta-x}In_xTe$.

* * * * *